United States Patent
Juang

(10) Patent No.: US 12,492,937 B2
(45) Date of Patent: Dec. 9, 2025

(54) ACTIVE CLAMP PHOTOELECTRIC SENSING DEVICE

(71) Applicant: ELITE SEMICONDUCTOR MICROELECTRONICS TECHNOLOGY INC., Hsinchu (TW)

(72) Inventor: Dar-Chang Juang, Hsinchu (TW)

(73) Assignee: ELITE SEMICONDUCTOR MICROELECTRONICS TECHNOLOGY INC., Hsinchu (TW)

(*) Notice: Subject to any disclaimer, the term of this patent is extended or adjusted under 35 U.S.C. 154(b) by 123 days.

(21) Appl. No.: 18/507,115

(22) Filed: Nov. 13, 2023

(65) Prior Publication Data
US 2024/0328853 A1    Oct. 3, 2024

(30) Foreign Application Priority Data
Mar. 30, 2023   (TW) ................................ 112112231

(51) Int. Cl.
| | |
|---|---|
| *G01J 1/44* | (2006.01) |
| *G01J 1/02* | (2006.01) |
| *H03F 3/08* | (2006.01) |
| *H03G 3/30* | (2006.01) |

(52) U.S. Cl.
CPC ............... *G01J 1/44* (2013.01); *G01J 1/0228* (2013.01); *H03F 3/087* (2013.01); *G01J 2001/444* (2013.01); *H03G 3/3084* (2013.01)

(58) Field of Classification Search
CPC ...... G01J 1/44; G01J 1/0228; G01J 2001/444; H03F 3/087; H03F 1/30; H03F 3/68; H03F 2200/447; H03G 3/3084; G01V 8/10; G01B 11/00
See application file for complete search history.

(56) References Cited

U.S. PATENT DOCUMENTS

| | | | |
|---|---|---|---|
| 5,663,671 A | 9/1997 | Steglich | |
| 6,633,028 B2* | 10/2003 | Fowler ................. | H10F 39/186 257/223 |
| 7,755,339 B2* | 7/2010 | Kojima ..................... | G05F 1/46 330/252 |
| 11,314,271 B2* | 4/2022 | Maki ...................... | G05F 1/462 |
| 2019/0004558 A1* | 1/2019 | Sakurai .................... | G05F 3/26 |

FOREIGN PATENT DOCUMENTS

CN          109506776 A       3/2019

* cited by examiner

*Primary Examiner* — Hung V Nguyen

(57) ABSTRACT

An active clamp photoelectric sensing device includes an input terminal, a first output terminal, a current-to-voltage conversion circuit, and an active clamp circuit. The input terminal receives an input current. The first output terminal outputs a first output voltage. The current-to-voltage conversion circuit is coupled between the input terminal and the first output terminal, and is used to discharge and lower potentials of the input terminal and the first output terminal to a first set voltage according to the state of a reset signal, or is used to gradually increase the first output voltage to a second set voltage. The active clamping circuit is coupled to the current-to-voltage conversion circuit, and is used to clamp the upper limit of the first output voltage to the second set voltage.

7 Claims, 5 Drawing Sheets

ACTIVE CLAMP PHOTOELECTRIC SENSING DEVICE

CROSS-REFERENCE TO RELATED APPLICATION

This non-provisional application claims priority under 35 U.S.C. § 119(a) on Patent Application No(s). 112112231 filed in Taiwan, R.O.C. on Mar. 30, 2023, the entire contents of which are hereby incorporated by reference.

BACKGROUND OF THE INVENTION

1. Field of the Invention

The present disclosure relates to a photoelectric sensor, and in particular to an active clamp photoelectric sensing device.

2. Description of the Related Art

A photoelectric sensor is a sensor that uses properties of light to detect an object. For example, the photoelectric sensor detects whether an object exists, or whether a change on a surface of an object takes place. Owing to advantages of having a long detection distance, a short response time, a high resolution, and a non-contact feature, photoelectric sensors are extensively applied in distance sensing techniques.

In some photoelectric sensing circuits, a photoelectric sensor may coordinate with a current-to-voltage conversion circuit, a clamp circuit and a determination circuit, so as to detect whether an object exists or approaches in the vicinity. For example, a photoelectric sensor generates a current signal corresponding to incident light, the current-to-voltage conversion circuit converts the current signal to a voltage signal and then provides the voltage signal to the determination circuit, and the determination circuit accordingly determines whether an object exists or approaches in the vicinity.

In normal use conditions, for smaller incident light, an operational amplifier in the current-to-voltage conversion circuit operates within a dynamic range. However, when the incident light gets overly large, an output from the operational amplifier of the current-to-voltage conversion circuit becomes saturated, leading to the problem of response delay. Thus, a common solution is to use a clamp circuit to prevent the output from the operational amplifier from such saturation, hence improving the problem of response delay.

In some conventional clamp circuits, there is an approach of clamping an output voltage to below a high supply voltage VDD, so as to improve the problem of response delay.

In some other conventional clamp circuits, there is an approach of connecting two series-connected diodes between an input terminal and an output terminal of the current-to-voltage conversion circuit, so as to improve the problem of response delay.

BRIEF SUMMARY OF THE INVENTION

The clamp circuits of the prior art above are capable of improving the problem of response delay. However, each time when the clamp circuits of the prior art above are reset, the potentials of the input terminal and the output terminal cannot fully return to set values, causing an offset in the clamping voltage. In other cases, due to influences of manufacturing processes and operating temperatures of diodes, the operational amplifier of the current-to-voltage conversion circuit may generate an incorrect output voltage that further leads to misjudgment issues of the determination circuit.

In view of the prior art above, the applicant has developed an active clamp photoelectric sensing device capable of improving the problem of response delay. In addition, in each reset, the potentials of an input terminal and an output terminal can be restored to set voltages, hence effectively solving the problem of clamping voltage offset. Moreover, the structure adopting an operational amplifier is less likely affected by influences of manufacturing processes and operating temperatures compared to diodes, so that the output voltage can be more stable, hence eliminating the issue of possible misjudgment of the determination circuit.

To achieve the above and other objects, the present disclosure provides an active clamp photoelectric sensing device including an input terminal, a first output terminal, a current-to-voltage conversion circuit, and an active clamp circuit. The input terminal receives an input current. The first output terminal outputs a first output voltage. The current-to-voltage conversion circuit is coupled between the input terminal and the first output terminal, and is used to discharge and lower the potentials of the input terminal and the first output terminal to a first set voltage according to the state of a reset signal, or is used to gradually increase the first output voltage to a second set voltage. The active clamp circuit is coupled to the current-to-voltage conversion circuit, and is used to clamp an upper limit of the first output voltage to the second set voltage.

In some embodiments, the current-to-voltage conversion circuit further includes: a first operational amplifier, having a first inverting input terminal, a first non-inverting input terminal, and a first amplifying output terminal, wherein the first inverting input terminal is coupled to the input terminal, the first non-inverting input terminal is coupled to the first set voltage, and the first amplifying output terminal is coupled to the first output terminal; a first switch, coupled between the first inverting input terminal and the first amplifying output terminal, turned on or turned off according to the state of the reset signal; and a first capacitor, coupled between the first inverting input terminal and the first amplifying output terminal.

In some embodiments, the active clamp circuit further includes: a second operational amplifier, having a second inverting input terminal, a second non-inverting input terminal, and a second amplifying output terminal, wherein the second non-inverting input terminal is coupled to the second set voltage, and the second inverting input terminal is coupled to the first output terminal; and a transistor switch, having a first terminal, a second terminal, and a third terminal, wherein the first terminal is coupled to the second amplifying output terminal, the second terminal is coupled to the first inverting input terminal, and the third terminal is coupled to the first amplifying output terminal.

In some embodiments, the transistor switch is a P-type field-effect transistor (FET) switch or an N-type FET switch.

In some embodiments, the first output terminal is further coupled to a sample and hold circuit. The sample and hold circuit includes: a second switch, coupled between the first output terminal and the second output terminal, the second switch being turned on or turned off according to a state of a sample and hold signal so as to convert the first output voltage to a second output voltage and to output the second output voltage from the second output terminal; and a second capacitor, coupled between the second output terminal and ground.

In some embodiments, a turn-on time of the second switch is earlier than a turn-on time of the first switch.

In some embodiments, the second switch is turned on according to a rising edge of the sample and hold signal, and is turned off according to a falling edge of the sample and hold signal.

In some embodiments, when the state of the reset signal is at a high voltage level, the first switch is turned on, and the potentials of the input terminal and the first output terminal are discharged and lowered to the first set voltage.

In some embodiments, when the state of the reset signal is at a low voltage level, the first switch is turned off, and the first output voltage is gradually increased to the second set voltage.

In some embodiments, when the first switch is turned on, the first capacitor is discharged to the first set voltage within a time of one pulse period of the reset signal.

The active clamp photoelectric sensing device of the present disclosure is capable of improving the problem of response delay. In addition, in each reset, the potentials of the input terminal and the output terminal can be restored to the first set voltage, hence effectively solving the problem of the prior art with regard to failure of fully returning to set values. Moreover, the clamping voltage is accurately controlled at the second set voltage, hence solving the problem of clamping voltage offset of the prior art. Furthermore, in addition to being less likely affected by influences of manufacturing processes and operating temperatures compared to diodes, the structure adopting an operational amplifier enables a more stable output voltage, and solves possible misjudgment of the determination circuit. In addition, the values of the first set voltage and the second set voltage can be adjusted to satisfy other circuit design requirements to enhance circuit application flexibilities.

DETAILED DESCRIPTION OF THE INVENTION

To facilitate understanding of the object, characteristics and effects of this present disclosure, embodiments together with the attached drawings for the detailed description of the present disclosure are provided below.

Figure 1:
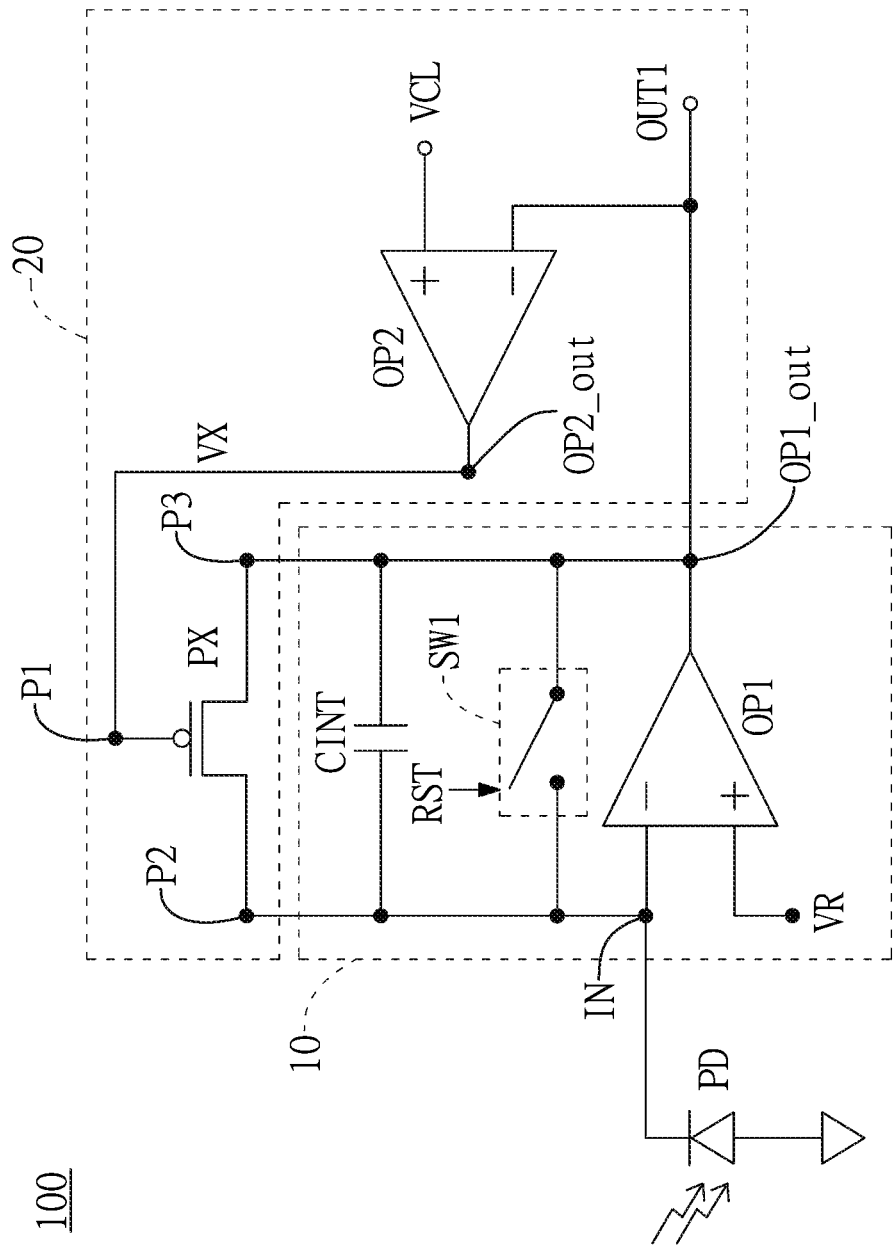
FIG. 1 is a schematic diagram of an active clamp photoelectric sensing device according to an embodiment of the present disclosure.

Refer to FIG. 1 showing a schematic diagram of an active clamp photoelectric sensing device according to an embodiment of the present disclosure. As shown in FIG. 1, an active clamp photoelectric sensing device 100 includes an input terminal IN, a first output terminal OUT1, a current-to-voltage conversion circuit 10 and an active clamp circuit 20.

The input terminal IN is individually coupled to the cathode of a photoelectric sensor PD and a first inverting input terminal of a first operational amplifier OP1. The anode of the photoelectric sensor PD is coupled to ground. The input terminal IN is used to receive an input current. More specifically, the photoelectric sensor PD generates a corresponding sensing current upon receiving light, wherein the sensing current is fed in by the input terminal IN and becomes the input current.

The first output terminal OUT1 is individually coupled to a first amplifying output terminal OP1_out of the first operational amplifier OP1 and a second inverting input terminal of a second operational amplifier OP2. The first output terminal OUT1 is used to output a first output voltage.

The current-to-voltage conversion circuit 10 is coupled between the input terminal IN and the first output terminal OUT1. The current-to-voltage conversion circuit 10 is used to discharge and lower the potentials of the input terminal IN and the first output terminal OUT1 to a first set voltage VR according to the state of a reset signal RST, or to gradually increase (for example, by means of integration) the first output voltage to a second set voltage VCL.

The current-to-voltage conversion circuit 10 includes the first operational amplifier OP1, a first switch SW1, and a first capacitor CINT. The first operational amplifier OP1 has a first inverting input terminal, a first non-inverting input terminal, and the first amplifying output terminal OP1_out. The first inverting input terminal is coupled to the input terminal IN. The first non-inverting input terminal is coupled to the first set voltage VR. The first amplifying output terminal OP1_out is coupled to the first output terminal OUT1.

The first switch SW1 is coupled between the first inverting input terminal and the first amplifying output terminal OP1_out. The first switch SW1 is turned on or turned off according to the state of the reset signal RST. For example, the first switch SW1 is turned on when the state of the reset signal RST is at a high voltage level; the first switch SW1 is turned off when the state of the reset signal RST is at a low voltage level. The first switch SW1 may be, for example, a P-type field-effect transistor (FET) switch or an N-type FET switch.

The first capacitor CINT is coupled between the first inverting input terminal and the first amplifying output terminal OP1_out. The first capacitor CINT generates a first capacitor voltage according to the input current. In other words, the first capacitor CINT is charged to the first capacitor voltage by the input current. When the state of the reset signal RST is at a high voltage level, the first switch SW1 is turned on, the first capacitor CINT is discharged, and the potentials of the input terminal IN and the first output terminal OUT1 are discharged and lowered to the first set voltage VR. When the state of the reset signal RST is at a low voltage level, the first switch SW1 is turned off, the input current generated by the photoelectric sensor PD is negative, and the first output voltage is gradually increased to the second set voltage VCL.

The active clamp circuit 20 is coupled to the current-to-voltage conversion circuit 10. The active clamp circuit 20 is used to clamp an upper limit of the first output voltage to the second set voltage VCL. The active clamp circuit 20 includes a second operational amplifier OP2 and a transistor switch PX. The second operational amplifier OP2 has a second inverting input terminal, a second non-inverting input terminal, and a second amplifying output terminal OP2_out. The second non-inverting input terminal is coupled to the second set voltage VCL. The second inverting input terminal is coupled to the first output terminal OUT1. The transistor switch PX has a first terminal P1, a second terminal P2, and a third terminal P3. The first terminal (for example, the gate) P1 is coupled to the second amplifying output terminal OP2_out. The second terminal (for example, the source) P2 is coupled to the first inverting input terminal. The third terminal (for example, the drain) P3 is coupled to the first amplifying output terminal OP1_out. In FIG. 1, a P-type FET switch is used as an example for illustration. In some embodiments, the transistor switch PX may also be an N-type FET switch.

The second operational amplifier OP2 outputs a trigger signal VX to the transistor switch PX according to the first output voltage and the second set voltage VCL. The transistor switch PX is turned on or turned off according to a state of the trigger signal VX. For example, the transistor switch PX is turned on when the trigger signal VX is at a low voltage level; the transistor switch PX is turned off when the trigger signal VX is at a high voltage level. Thus, the first output voltage is caused to gradually increase without exceeding the second set voltage VCL. In other words, the upper limit of the first output voltage is clamped at the second set voltage VCL. The second set voltage VCL is the clamping voltage. Thus, the clamping voltage can be accurately controlled at the second set voltage VCL, hence solving the problem of clamping voltage offset of the prior art. In addition, with the structure of the operational amplifiers adopted by the current-to-voltage conversion circuit 10 and the active clamp circuit 20, besides being less likely affected by influences of manufacturing processes and operating temperatures compared to diodes, the values of the first set voltage VR and the second set voltage VCL can be adjusted to satisfy other circuit design requirements to enhance circuit application flexibilities.

Figure 2:
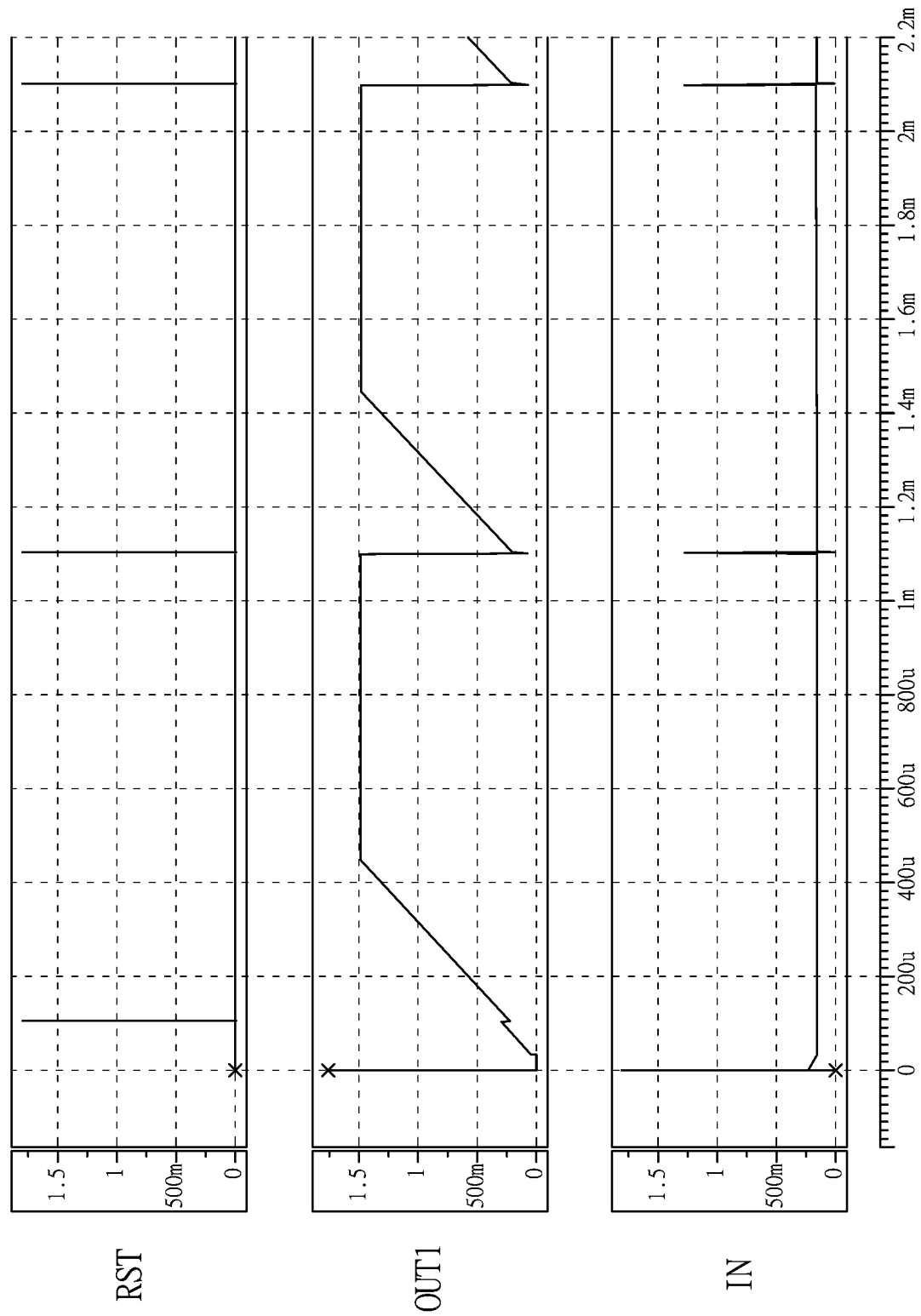
FIG. 2 is a schematic timing diagram according to an embodiment of the present disclosure.

Refer to FIG. 2 showing a schematic timing diagram according to an embodiment of the present disclosure. As shown in FIG. 2, the horizontal axis represents time and the vertical axis represents voltage. From the top to the bottom, voltage waveforms of the reset signal RST, the first output terminal OUT1, and the input terminal IN are respectively depicted.

When the reset signal RST is at a low voltage level, the first switch SW1 is turned off, and the voltage of the first output terminal OUT1 is gradually increased to the second set voltage VCL. The second set voltage VCL is approximately 1.45 V. It is learned that, once the voltage of the first output terminal OUT1 approximates 1.45 V, clamping takes places up to the next reset signal RST. When the next reset signal RST is at a high voltage level, the first switch SW1 is turned on, the voltages of the input terminal IN and the first output terminal OUT1 are discharged to the first set voltage VR, and cycles occur accordingly. In other words, after each reset signal RST, the voltage waveform of the first output terminal OUT1 is restored to the first set voltage VR (approximately 0.193 V). Thus, each starting value (approximately 0.193 V) of the voltage waveform of the first output terminal OUT1 is the same. Similarly, after each reset signal RST, the voltage waveform of the input terminal IN is restored to the first set voltage VR. Thus, the issue regarding failure of fully returning to set values of the potentials of the input terminal and the output terminal of the prior art is eliminated.

Figure 3:
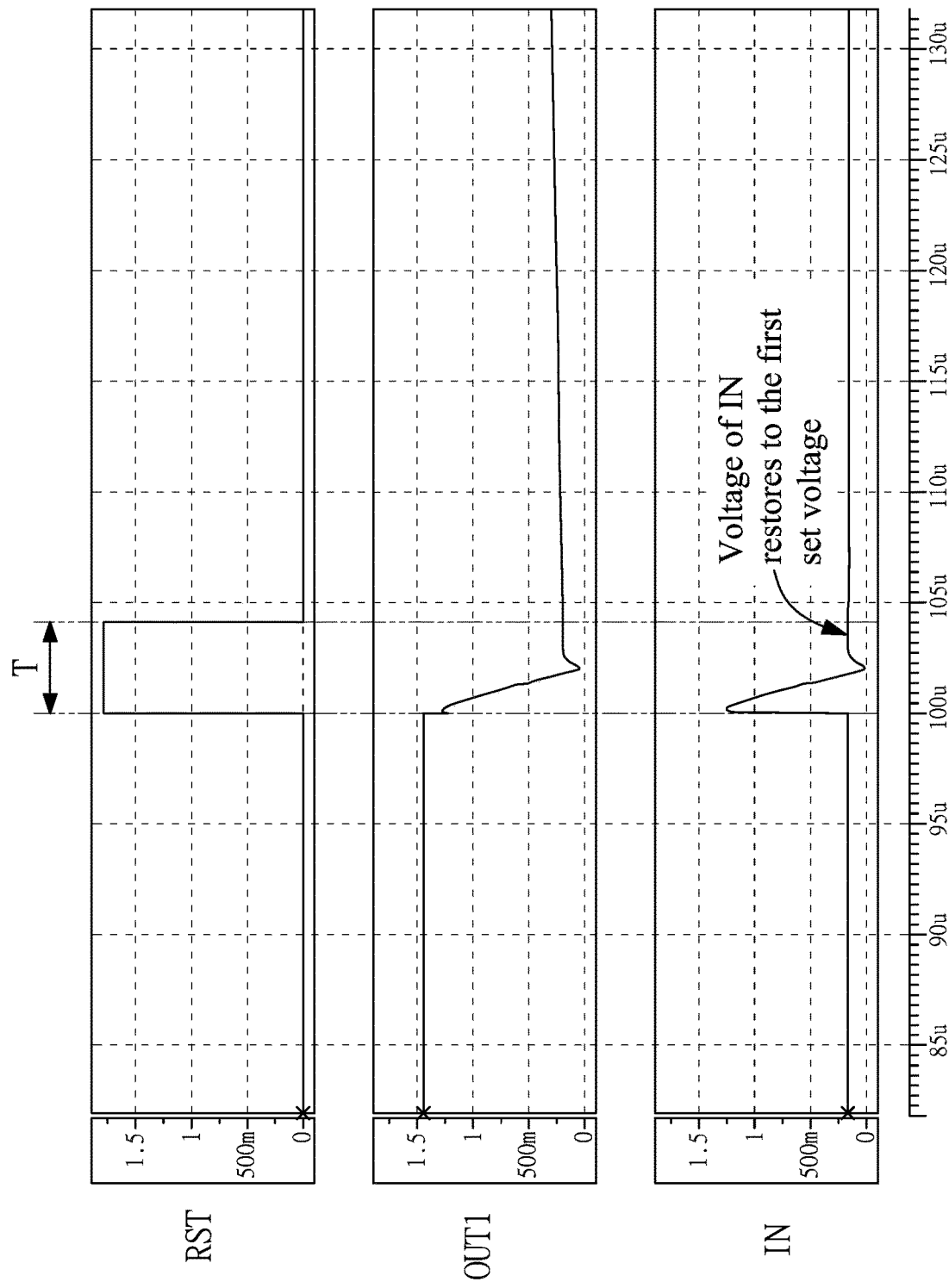
FIG. 3 is an enlarged schematic diagram of voltage waveforms according to FIG. 2.

Refer to FIG. 3 showing an enlarged schematic diagram of voltage waveforms according to FIG. 2. As shown in FIG. 3, it can be better observed that, when the first switch SW1 is turned on, the voltages of the input terminal IN and the first output terminal OUT1 are discharged to the first set voltage VR. The voltage of the input terminal IN may correspond to the voltage of the first capacitor CINT. In other words, the first capacitor CINT is discharged to the first set voltage VR within the time of one pulse period T of the reset signal RST. Thus, it is ensured that the voltage of the input terminal IN and the voltage of the first output terminal OUT1 are restored to the set value (that is, the first set voltage VR).

Figure 4:
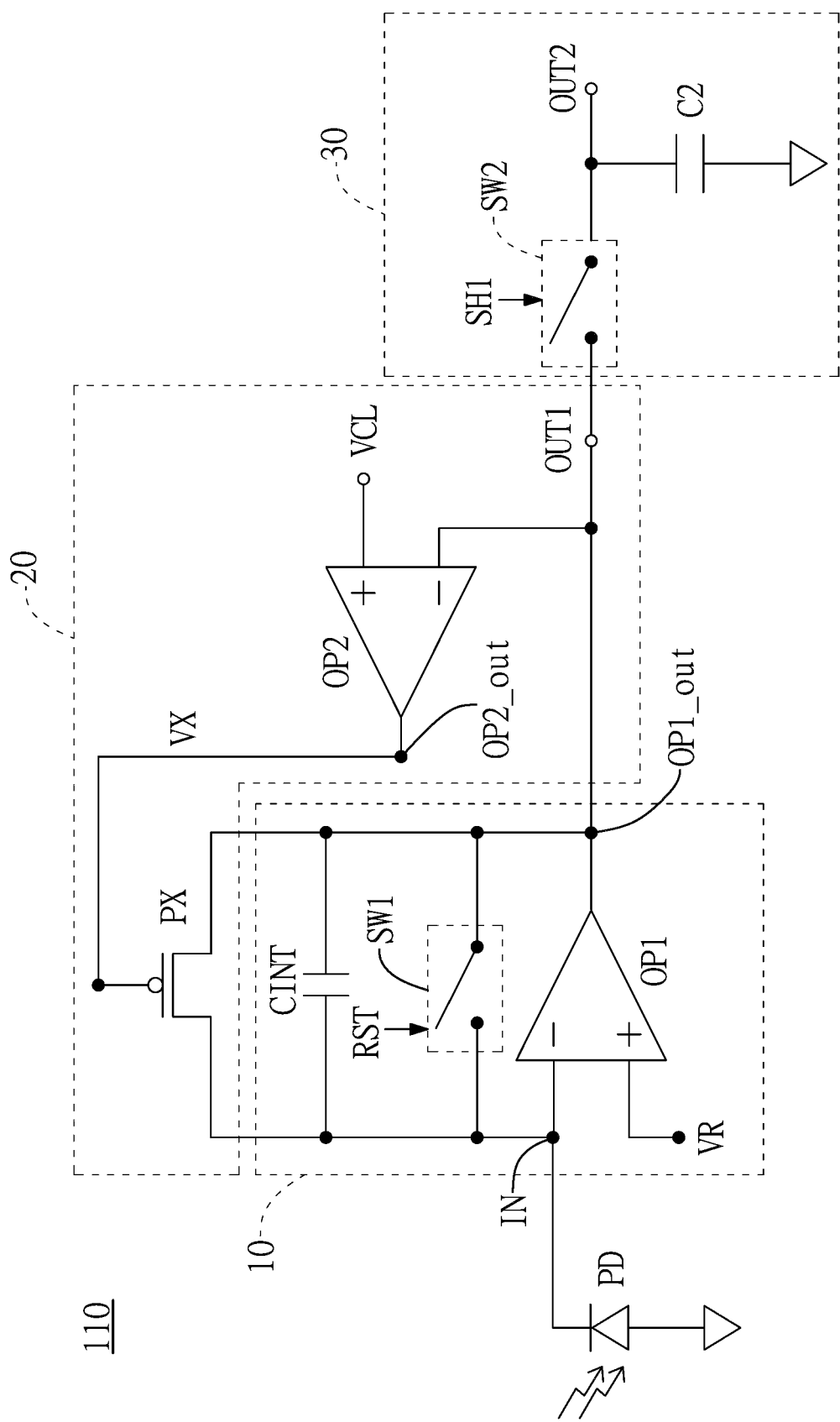
FIG. 4 is a schematic diagram of an active clamp photoelectric sensing device according to another embodiment of the present disclosure.

Refer to FIG. 4 showing a schematic diagram of an active clamp photoelectric sensing device according to another embodiment of the present disclosure. As shown in FIG. 4, an active clamp photoelectric sensing device 110 differs from the embodiment in FIG. 1 in that, the first output terminal OUT1 is further coupled to a sample and hold circuit 30, and the remaining details regarding the photoelectric sensor PD, the current-to-voltage conversion circuit 10, and the active clamp circuit 20 are the same as those of the embodiment in FIG. 1 and are thus not discussed in detail again.

Figure 5:
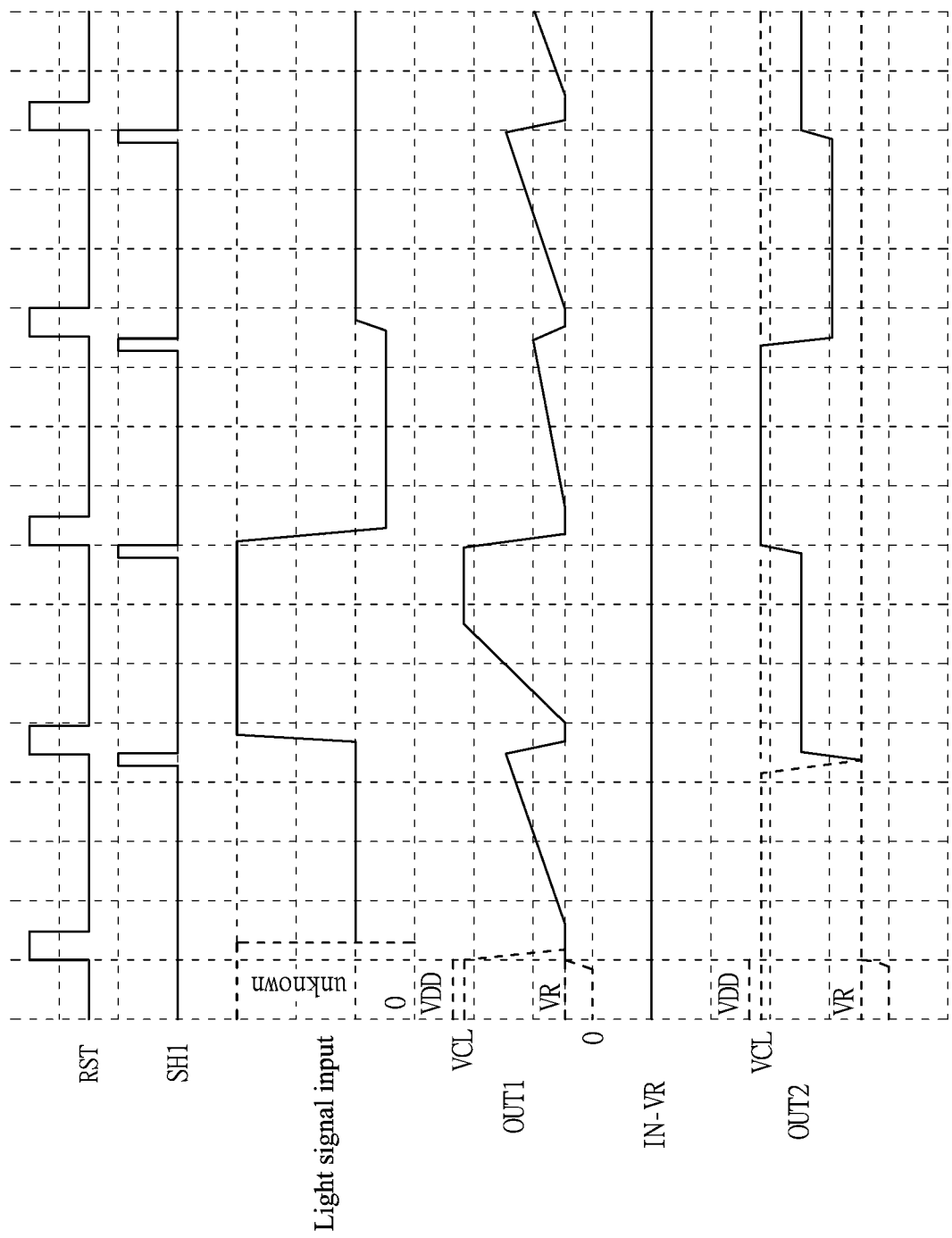
FIG. 5 is a schematic timing diagram according to the embodiment of FIG. 4.

The sample and hold circuit 30 includes a second switch SW2 and a second capacitor C2. The second switch SW2 is coupled between the first output terminal OUT1 and a second output terminal OUT2. The second switch SW2 is turned on or turned off according to a state of a sample and hold signal SH1, so as to convert the first output voltage to a second output voltage and to output the second output voltage from the second output terminal OUT2. As shown in FIG. 5, since the rising edge of the sample and hold signal SH1 is earlier than the rising edge of the reset signal RST, the turn-on time of the second switch SW2 is earlier than the turn-on time of the first switch SW1. The second switch SW2 may be, for example, a P-type FET switch or an N-type FET switch. The second capacitor C2 is coupled between the second output terminal OUT2 and ground.

Refer to FIG. 5 showing a schematic timing diagram according to the embodiment of FIG. 4. As shown in FIG. 5, the horizontal axis represents time and the vertical axis represents voltage. From the top to the bottom, voltage waveforms of the reset signal RST, the sample and hold signal SH1, a light signal input, the first output terminal OUT1, the input terminal IN, and the second output terminal OUT2 are respectively depicted. It is learned that, when the light signal input is in an unknown stage, the voltage of the first output terminal OUT1 may be 0, the first set voltage VR, or the second set voltage VCL. After the first reset signal RST, the voltage of the first output terminal OUT1 is restored to the first set voltage VR. When a high intensity light signal is continuously input, the voltage of the first output terminal OUT1 gradually increases and is clamped at the second set voltage VCL. The second set voltage VCL is less than the high supply voltage VDD. Moreover, the voltage of the input terminal IN is steadily maintained at the first set voltage VR. A suddenly increased light signal will not cause the first operational amplifier OP1 of the current-to-voltage conversion circuit 10 to generate an incorrect output voltage and further cause signal misjudgment.

In conclusion of the above, the active clamp photoelectric sensing device of the present disclosure is capable of ensuring that the potentials of the input terminal and the output terminal are restored to the first set voltage for each reset, hence effectively solving the problem of the prior art regarding failure of fully returning to set values. Moreover, the clamping voltage is accurately controlled at the second set voltage, hence solving the problem of clamping voltage offset of the prior art. Furthermore, besides being less likely affected by influences of manufacturing processes and operating temperatures compared to diodes, the structure adopting an operational amplifier enables a more stable output voltage, and solves possible misjudgment of the determination circuit. In addition, the values of the first set voltage and the second set voltage can be adjusted to satisfy other circuit design requirements to enhance circuit application flexibilities.

The present invention has been disclosed by way of the preferred embodiments above. A person skilled in the art should understand that, these embodiments are merely for illustrating the present invention, and are not to be construed as limitations to the scope of the present invention. It should be noted that all equivalent changes, replacements and substitutions made to the embodiments are encompassed within the scope of the present invention. Therefore, the scope of legal protection for the present invention should be defined by the appended claims.

What is claimed is:

1. An active clamp photoelectric sensing device, comprising:
    an input terminal, for receiving an input current;
    a first output terminal, for outputting a first output voltage;
    a current-to-voltage conversion circuit, coupled between the input terminal and the first output terminal, used to discharge and lower potentials of the input terminal and the first output terminal to a first set voltage according to a state of a reset signal, or used to gradually increase the first output voltage to a second set voltage; and
    an active clamp circuit, coupled to the current-to-voltage conversion circuit, used to clamp an upper limit of the first output voltage to the second set voltage,
    wherein the current-to-voltage conversion circuit further comprises:
        a first operational amplifier, having a first inverting input terminal, a first non-inverting input terminal, and a first amplifying output terminal, wherein the first inverting input terminal is coupled to the input terminal, the first non-inverting input terminal is coupled to the first set voltage, and the first amplifying output terminal is coupled to the first output terminal;
        a first switch, coupled between the first inverting input terminal and the first amplifying output terminal, turned on or turned off according to the state of the reset signal; and
        a first capacitor, coupled between the first inverting input terminal and the first amplifying output terminal;
    wherein when the state of the reset signal is at a high voltage level, the first switch is turned on, and the potentials of the input terminal and the first output terminal are discharged and lowered to the first set voltage; and
    wherein when the state of the reset signal is at a low voltage level, the first switch is turned off, and the first output voltage is gradually increased to the second set voltage.

2. The active clamp photoelectric sensing device according to claim 1, wherein the active clamp circuit further comprises:
    a second operational amplifier, having a second inverting input terminal, a second non-inverting input terminal, and a second amplifying output terminal, wherein the second non-inverting input terminal is coupled to the second set voltage, and the second inverting input terminal is coupled to the first output terminal; and
    a transistor switch, having a first terminal, a second terminal, and a third terminal, wherein the first terminal is coupled to the second amplifying output terminal, the second terminal is coupled to the first inverting input terminal, and the third terminal is coupled to the first amplifying output terminal.

3. The active clamp photoelectric sensing device according to claim 2, wherein the transistor switch is a P-type field-effect transistor (FET) switch or an N-type FET switch.

4. The active clamp photoelectric sensing device according to claim 2, wherein the first output terminal is further coupled to a sample and hold circuit, and the sample and hold circuit comprises:
    a second switch, coupled between the first output terminal and a second output terminal, the second switch being turned on or turned off according to a state of a sample and hold signal so as to convert the first output voltage to a second output voltage and to output the second output voltage from the second output terminal; and
    a second capacitor, coupled between the second output terminal and ground.

5. The active clamp photoelectric sensing device according to claim 4, wherein a turn-on time of the second switch is earlier than a turn-on time of the first switch.

6. The active clamp photoelectric sensing device according to claim 4, wherein the second switch is turned on according to a rising edge of the sample and hold signal, and is turned off according to a falling edge of the sample and hold signal.

7. The active clamp photoelectric sensing device according to claim 1, wherein when the first switch is turned on, the first capacitor is discharged to the first set voltage within a time of one pulse period of the reset signal.

* * * * *